(12) United States Patent
Furuya et al.

(10) Patent No.: US 8,742,826 B2
(45) Date of Patent: Jun. 3, 2014

(54) ACTIVE CLAMP CIRCUIT

(75) Inventors: Miki Furuya, Kanagawa-ken (JP); Satoru Kodama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 67 days.

(21) Appl. No.: 13/406,760

(22) Filed: Feb. 28, 2012

(65) Prior Publication Data
US 2013/0021083 A1    Jan. 24, 2013

(30) Foreign Application Priority Data
Jul. 21, 2011 (JP) .................................. 2011-159974

(51) Int. Cl.
*H03K 17/687* (2006.01)

(52) U.S. Cl.
USPC ............ 327/427; 327/434; 327/323; 361/91.2

(58) Field of Classification Search
USPC ......... 327/109, 108, 110, 177, 309, 310, 321, 327/323, 427, 434, 478, 489, 490, 502, 504, 327/584; 323/268, 271, 276, 277, 278; 361/90, 91.1, 91.2
See application file for complete search history.

(56) References Cited

U.S. PATENT DOCUMENTS

| | | | | |
|---|---|---|---|---|
| 5,892,398 | A | * | 4/1999 | Candy ........................... 330/156 |
| 6,087,877 | A | * | 7/2000 | Gonda et al. .................. 327/309 |
| 6,351,162 | B1 | * | 2/2002 | Schwartz ....................... 327/110 |

FOREIGN PATENT DOCUMENTS

| | | | |
|---|---|---|---|
| JP | 2004-032893 | A | 1/2004 |
| JP | 2008-035067 | * | 2/2008 |
| JP | 2008-035067 | A | 2/2008 |

OTHER PUBLICATIONS

Background Art Information Sheet provided by applicants, Dec. 13, 2011 (1 page total).

* cited by examiner

*Primary Examiner* — Lincoln Donovan
*Assistant Examiner* — Jung H Kim
(74) *Attorney, Agent, or Firm* — Posz Law Group, PLC

(57) ABSTRACT

According to one embodiment, an active clamp circuit includes a first switch element, a first diode, a first resistance, a first control circuit and a second control circuit. The first diode is connected to the first switch element and breaks down by an overvoltage applied to the first switch element. The first resistance is connected to the first diode and detects a current through the first diode. The first control circuit is configured to amplify a voltage across the first resistance and controls a current through the first switch element. The second control circuit is configured to control a conduction of the first switch element in accordance with the voltage across the first resistance.

19 Claims, 5 Drawing Sheets

FIG. 2A  In 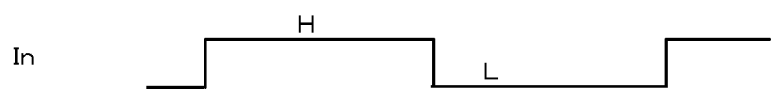
FIG. 2B  Drv2 
FIG. 2C  Drv1 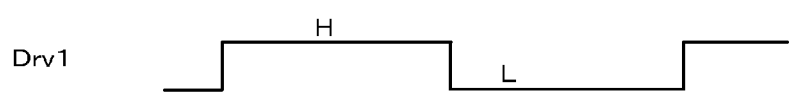
FIG. 2D  Id 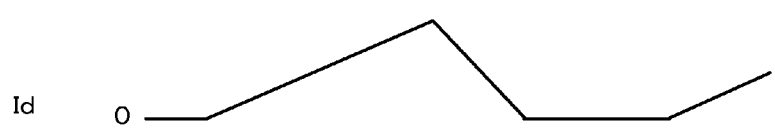
FIG. 2E  Out 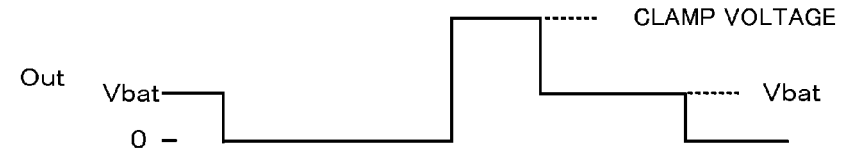

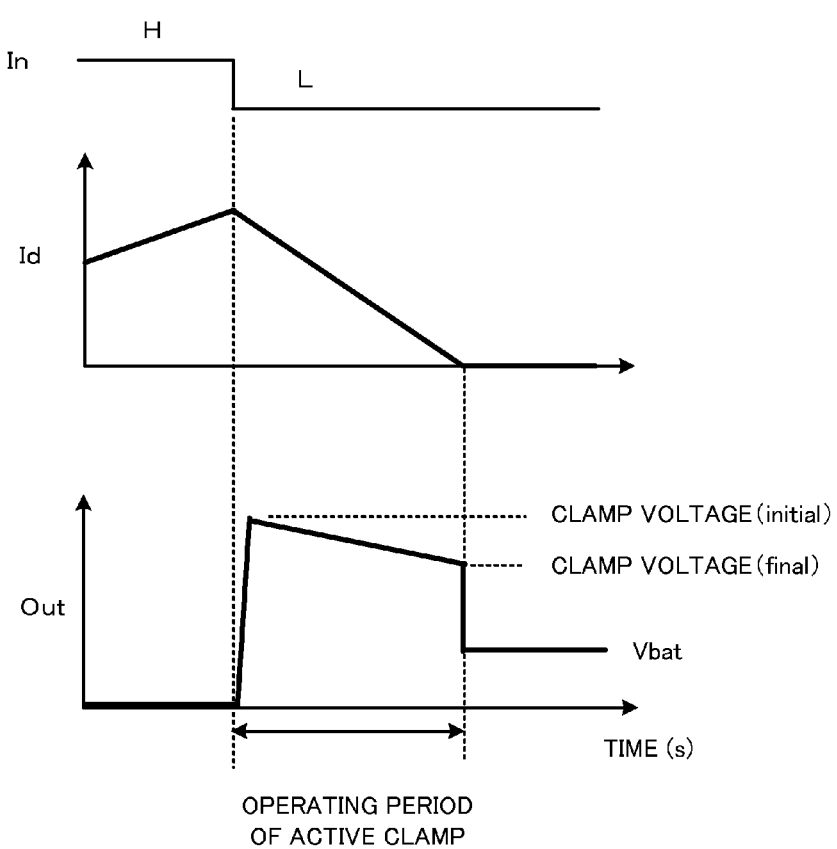

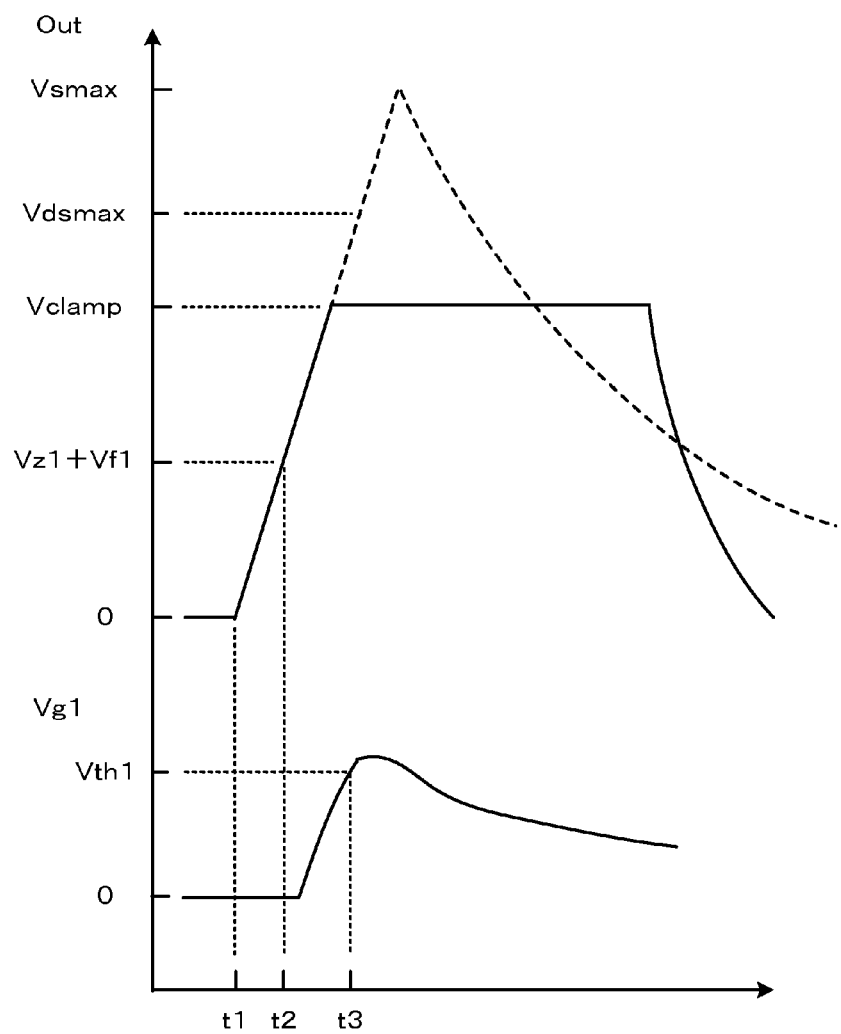

US 8,742,826 B2

ACTIVE CLAMP CIRCUIT

CROSS REFERENCE TO RELATED APPLICATION

This application is based upon and claims the benefit of priority from the prior Japanese Patent Application No. 2011-159974, filed on Jul. 21, 2011, the entire contents of which are incorporated herein by reference.

FIELD

Embodiments described herein relate generally to an active clamp circuit.

BACKGROUND

In a case where an inductive load such as a solenoid valve and a motor is driven on or off, an induced voltage is generated by energy accumulated while the inductive load is off. An active clamp circuit is used to protect a switch element and the like from the induced voltage. The active clamp circuit clamps the induced voltage at a predetermined value to absorb the energy accumulated in the inductive load.

However, a clamp voltage, which depends on an amount of current that flows through the active clamp circuit, is high at the start of the clamp operation and reduces over time. For example, the clamp voltage changes due to a fluctuation of a current-voltage characteristic and the like of the zener diode when the induced voltage is clamped by breaking down a zener diode.

An operation period of active clamp is a wasteful time period during which the inductive load cannot be driven and thus is preferably short.

Moreover, while the active clamp circuit is not supplied with a power supply voltage, the active clamp circuit does not operate and thus the switch element and the like may be broken by electrostatic discharge (ESD).

BRIEF DESCRIPTION OF THE DRAWINGS

FIGS. 2A to 2E are timing charts showing an operation of the active clamp circuit according to the first embodiment;

FIGS. 3A to 3C are timing charts showing an operation of an active clamp circuit of a comparative example according to the first embodiment;

FIGS. 4A and 4B are timing charts showing another operation of the active clamp circuit according to the first embodiment;

DETAILED DESCRIPTION

Figure 1:
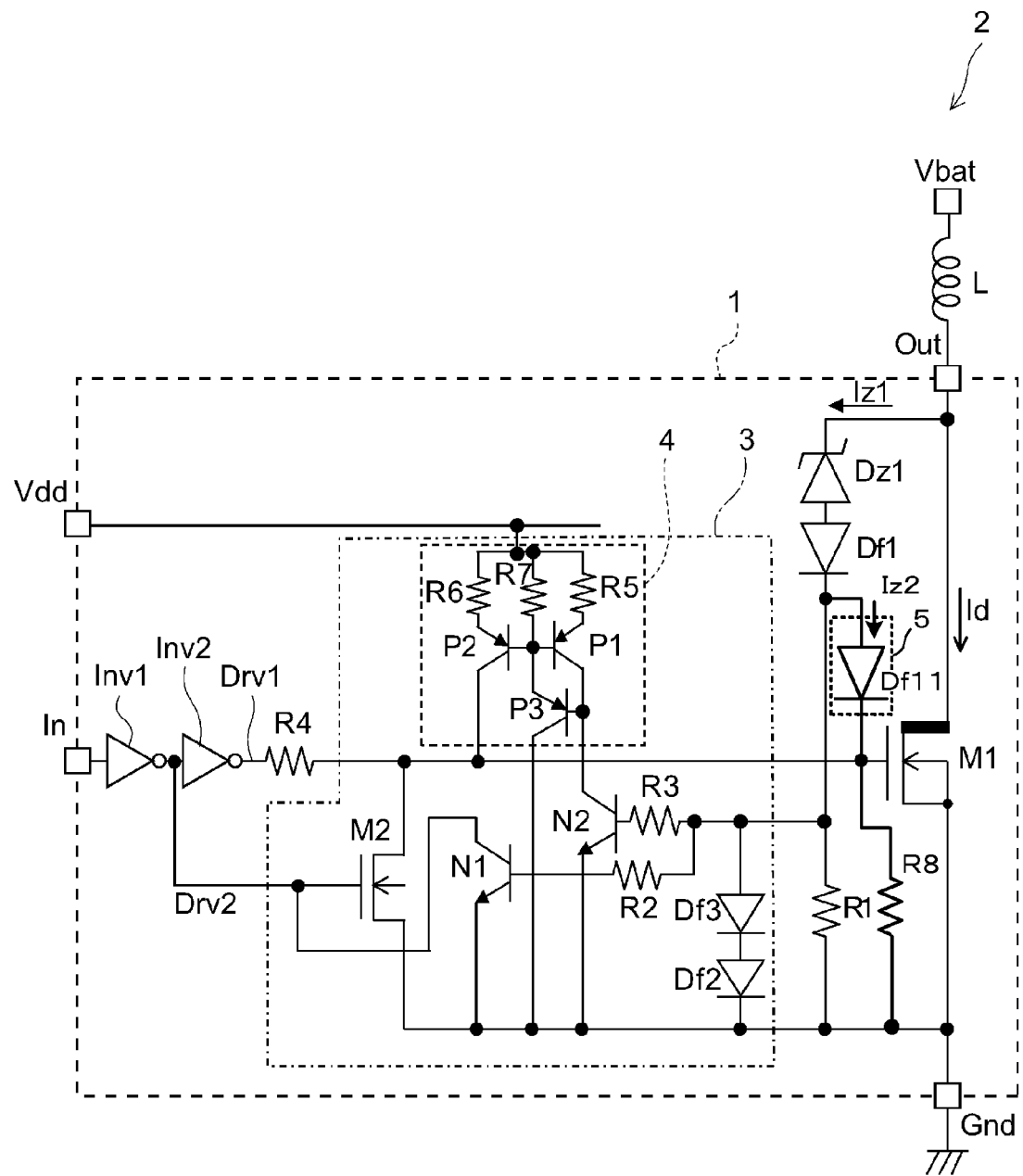
FIG. 1 is a circuit diagram showing a configuration of a driving circuit including an active clamp circuit according to a first embodiment.

According to one embodiment, an active clamp circuit includes a first switch element, a first diode, a first resistance, a first control circuit and a second control circuit. The first diode is connected to the first switch element and breaks down by an overvoltage applied to the first switch element. The first resistance is connected to the first diode and detects a current through the first diode. The first control circuit is configured to amplify a voltage across the first resistance and controls a current through the first switch element. The second control circuit is configured to control a conduction of the first switch element in accordance with the voltage across the first resistance.

Hereinafter, embodiments will be described with reference to the drawings. In the drawings, same reference characters denote the same or similar portions.

First Embodiment

An active clamp circuit of a first embodiment will be described with reference to FIGS. 1 to 4B. FIG. 1 is a circuit diagram showing the active clamp circuit of the first embodiment. FIGS. 2A to 2E are timing charts showing an operation of the active clamp circuit. FIGS. 3A to 3C are timing charts showing an operation of an active clamp circuit of a comparative example. FIGS. 4A to 4B are timing charts showing another operation of the active clamp circuit.

FIG. 1 is a circuit diagram showing an exemplary configuration of a driving circuit including the active clamp circuit of the first embodiment. FIG. 1 shows an exemplary configuration in which an active clamp circuit 1 is used in a driving circuit 2.

FIGS. 2A to 2E respectively show a control signal In, a driving signal Drv2, a driving signal Drv1, a current Id through a first switch element M1, and a voltage Out across the first switch element M1.

The active clamp circuit 1 turns the first switch element M1 on or off in accordance with a level of the control signal In. A first diode Dz1 breaks down by an overvoltage applied to the first switch element M1, and thus the voltage Out across the first switch element M1 is clamped at a clamp voltage of a predetermined value. A current Iz1 through the first diode Dz1 is detected by a first resistance R1. A voltage Vr1 across the first resistance R1 is amplified by a control circuit 3 (first control circuit) so that the current Id through the switch element M1 is controlled.

Furthermore, the active clamp circuit 1 turns on the first switch element M1 through a diode Df11 (second diode) as a control circuit 5 (second control circuit) in accordance with the voltage Vr1 across the first resistance R1 in response to an event where a surge is applied to the first switch element M1 while the power supply voltage Vdd is not supplied or grounded to a Gnd potential.

The first switch element M1 is formed of an N-channel MOSFET (hereinafter referred to as NMOS).

The control signal In is inputted to a gate of the first switch element M1 through a resistance R4 and inverters Inv1, Inv2. The inverter Inv1 outputs the driving signal Drv2 obtained by inverting the control signal In. The inverter Inv2 outputs the driving signal Drv1 obtained by inverting the driving signal Drv2. The driving signal Drv1 is in-phase with the control signal In. The driving signal Drv1 is inputted to the gate of the first switch element M1 through the resistance R4. The first switch element M1 is turned on or off in accordance with the level of the control signal In.

A cathode of the first diode Dz1 is connected to a drain of the first switch element M1. An anode and a cathode of a diode Df1 (fourth diode) are respectively connected to an anode of the first diode Dz1 and one end of the first resistance R1. The other end of the first resistance R1 is connected to the ground Gnd.

The first diode Dz1 breaks down by an overvoltage. Thus, a voltage across the first switch element M1 is clamped at a voltage at which the first diode Dz1 breaks down. The current Iz1 flows through the first diode Dz1 when the first diode Dz1 breaks down.

A voltage Vclamp at which the voltage Out across the first switch element M1 is clamped is Vz1+Vf1+Vr1, where Vz1 is the voltage at which the first diode Dz1 breaks down, Vf1 is a forward voltage of the diode Df1, and Vr1 is a voltage across the first resistance R1.

The first diode Dz1 is formed of a zener diode for example. In FIG. 1, an exemplary configuration is shown in which the first diode Dz1 is formed of a single zener diode. In accordance with a voltage at which the voltage Out across the first switch element M1 is clamped, the first diode Dz1 may be formed by connecting an appropriate number of zener diodes in series.

The diode Df1 is used to compensate the temperature of the first diode Dz1 and to prevent a reverse flow when the first switch element M1 is on.

The first resistance R1 detects the current Iz1 that flows when the first diode Dz1 breaks down. Specifically, when the first diode Dz1 breaks down, the current Iz1 flows through the first resistance R1 and the voltage Vr1 is generated across the first resistance R1.

The control circuit 3 includes an amplifier circuit N2 that amplifies the voltage Vr1 across the first resistance R1 and outputs a current, and a current mirror 4 to receive the current which is outputted from the amplifier circuit N2 and control a current Id through the first switch element M1.

The amplifier circuit N2 is formed of an npn transistor. The voltage Vr1 across the first resistance R1 is inputted to a base of the amplifier circuit N2 through a resistance R3. The resistance R3 is inserted to delay the input of the voltage to the base of the amplifier circuit N2 to adjust the timing.

The diodes Df2, Df3 (third diode) are connected between both ends of the first resistance R1 so as to protect between the base and an emitter of the amplifier circuit N2. The diodes Df2, Df3 regulate the voltage Vr1 across the first resistance R1 so that the voltage Vr1 does not exceed Vf2+Vf3, where Vf2, Vf3 are forward voltages of the diodes Df2, Df3, respectively. It is necessary to satisfy the relationship Vf2+Vf3>Vr3+VbeN2, where VbeN2 is a base-emitter voltage of the amplifier circuit N2 and Vr3 is a voltage across the resistance R3.

A collector of the amplifier circuit N2 is connected to a reference side of the current mirror 4. An output side of the current mirror 4 is connected to the gate of the first switch element M1. A current which is outputted from the amplifier circuit N2 is reflected by the current mirror 4 and controls the first switch element M1.

The current mirror 4 includes resistances R5 to R7 and transistors P1 to P3. The transistors P1 to P3 are each a pnp transistor. The power supply voltage Vdd is supplied to an emitter of the transistor P1 through the resistance R5, supplied to an emitter of the transistor P2 through the resistance R6, and supplied to a base of each of the transistors P1, P2 through the resistance R7.

A collector of the transistor P3 is connected to the base of each of the transistors P1, P2. A base and the collector of the transistor P3 are respectively connected to a collector of the transistor P1 and the ground Gnd.

A collector of the transistor P1 and the base of the transistor P3 are connected to the collector of the amplifier circuit N2 as the reference side of the current mirror 4. The collector of the transistor P2 is connected to the gate of the first switch element M1 as an output side.

A second switch element M2 is connected between the gate of the first switch element M1 and the ground. A gate of the second switch element M2 is connected to an output side of the inverter Inv1. The driving signal Drv2 obtained by inverting the control signal In is inputted to the gate of the second switch element M2.

A transistor N1 is connected between the gate of the second switch element M2 and the ground Gnd. The transistor N1 is an npn transistor. A collector and an emitter of the transistor N1 are respectively connected to the gate of the second switch element M2 and the ground Gnd. The voltage Vr1 across the first resistance R1 is inputted to a base of the transistor N1 through the resistance R2.

The resistance R2 is inserted to delay the input of the voltage to the base of the transistor N1 to adjust the timing.

The diodes Df2, Df3 also protect the transistor N1. It is necessary to satisfy the relationship Vf2+Vf3>Vr2+VbeN1, where VbeN1 is a base-emitter voltage of the transistor N1 and Vr2 is the voltage across the resistance R2.

The driving circuit 2 drives the inductive load L with the active clamp circuit 1. One end of the inductive load L is supplied with a voltage Vbat and the other end of the inductive load L is connected to the ground Gnd through the active clamp circuit 1.

The first switch element M1 is turned on or off in accordance with a voltage at which the voltage Out across the first switch element M1 is clamped, the first diode Dz1 may be formed by connecting an appropriate number of zener diodes in series.

The level of the control signal In of the active clamp circuit 1, and thus the current that flows through the inductive load L is controlled. The current that flows through the inductive load L is a combined current of the current Id through the first switch element M1 and the current Iz1 through the first diode Dz1 of the active clamp circuit 1.

FIGS. 2A to 2E are waveform diagrams of main signals of the active clamp circuit shown in FIG. 1. FIGS. 2A to 2E respectively show the control signal In, the driving signal Drv2, the driving signal Drv1, the current Id through the first switch element, and the voltage Out across the first switch element.

FIGS. 2A to 2E are schematic waveform diagrams of the main signals where a rectangular wave switching between high and low is inputted as the control signal In of the active clamp circuit 1.

An operation of the active clamp circuit 1 will be described with reference to FIGS. 2A to 2E.

As shown in FIG. 2A and FIG. 2C, when the control signal In is at a high level, the driving signal Drv1 inputted to the gate of the first switch element M1 is at the high level. Meanwhile, the driving signal Drv2 inputted to the gate of the second switch element M2 is at a low level (FIG. 2B). Thus, the second switch element M2 is in an OFF state, whereas the first switch element M1 is in an ON state and thus the current Id flows through the first switch element M1 (FIG. 2D). The inductive load L is driven as the voltage Vbat is supplied and a current flows. The voltage Out across the first switch element M1 is substantially 0 V (FIG. 2E).

When the control signal In switches from the high level to the low level (FIG. 2A), the driving signal Drv1 switches to the low level (FIG. 2C), and the driving signal Drv2 switches to the high level (FIG. 2B). Thus, the second switch element M2 is in the ON state and the first switch is in the OFF state and the induced voltage is generated in the inductive load L.

When the voltage Out across the first switch element M1 exceeds a predetermined value, the first diode Dz1 breaks down. When the first diode Dz1 breaks down, the voltage across the first switch element M1 is clamped at the clamp voltage Vclamp represented by the following formula (FIG. 2E).

$$V\text{clamp} = Vz1 + Vf1 + Vr1 \qquad (1)$$

The current Iz1 through the first diode Dz1 is detected by the first resistance R1 and generates a voltage corresponding to the current Iz1 across the first resistance R1.

The voltage Vr1 across the first resistance R1 is amplified by the amplifier circuit N2 and the current which is outputted from the amplifier circuit N2 is reflected by the current mirror 4 to be inputted to the first switch element M1. The current Id through the first switch element M1 is controlled by the control circuit 3 that amplifies the voltage across the first resistance R1.

When the first switch element M1 turns from ON to OFF, the voltage Out across the first switch element M1 rises due to the induced voltage in the inductive load L. The induced voltage in the inductive load L is proportional to the product of a change ratio of the current through the inductive load L with respect to time and an inductance of the inductive load L.

The current through the inductive load L sharply changes and thus a high induced voltage is generated by the inductive load L right after the first switch element M1 turns from ON to OFF. Thus, the current Iz1 is large and the voltage across the first resistance R1 is high right after the first diode Dz1 breaks down.

The energy accumulated in the inductive load L makes the current flow through the inductive load L. Thus, the current through the inductive load L reduces over time after the first switch element M1 turns from ON to OFF (FIG. 2D).

In the control circuit 3, the diodes Df2, Df3 are connected between both ends of the first resistance R1. Thus, the voltage Vr1 across the first resistance R1 is regulated at the sum of the forward voltage Vf2+Vf3 of the diodes Df2, Df3. The control circuit 3 amplifies the regulated voltage to control the first switch element M1. Thus, the current Id through the first switch element M1 flowing right after the first diode Dz1 breaks down is also regulated.

The control circuit 3 amplifies the voltage Vr1 across the first resistance R1 to control the first switch element M1. Thus, the current Id through the first switch element M1 can be controlled even when the current Iz through the first diode Dz1 is reduced.

Thus, the control circuit 3 prevents the sharp change of the current through the inductive load L right after the first switch element M1 turns from ON to OFF, and suppresses the reduction rate of the current through the inductive load L.

Thus, the sharp rise of the induced voltage of the inductive load L right after the first switch element M1 turns from ON to OFF can be prevented, and the reduction rate of the induced voltage reducing over time can be regulated (FIG. 2E).

When all the energy accumulated in the inductive load L is consumed, the current Id through the first switch element becomes 0 (FIG. 2D). The induced voltage also becomes 0 and the voltage Out across the first switch element M1 becomes equal to the voltage Vbat supplied to the inductive load L (FIG. 2E).

As described above, in the active clamp circuit 1, the control circuit 3 amplifies the voltage Vr1 across the first resistance R1 to control the current Id through the first switch element M1. Thus, the reduction of the clamp voltage Vclamp can be suppressed so that the clamp voltage Vclamp stays a constant value.

Thus, the operating period of active clamp during which the current Id flows through the first switch element M1 can be shortened.

The effect of the control circuit 3 can be understood more in detail by considering an operation in a case where the control circuit 3 is not provided.

FIGS. 3A to 3C are waveform diagrams of the main signals in an active clamp circuit that does not include the control circuit. FIG. 3A shows the control signal In. FIG. 3B shows the current Id through the first switch element. FIG. 3C shows the voltage Out across the first switch element.

FIGS. 3A to 3C schematically show waveforms of a case where the control circuit 3 is removed from the active clamp circuit 1 shown in FIG. 1 and the first switch element M1 is controlled by the voltage across the first resistance R1.

As shown in FIGS. 3A to 3C, the current Id through the first switch element M1 and the voltage Out across the first switch element M1 are respectively the same as those shown in FIG. 2D and FIG. 2E.

When the control signal In switches from the high level to the low level, the first diode Dz1 breaks down and the voltage Out across the first switch element M1 is clamped at a clamp voltage (initial) (FIG. 3C).

Without the control circuit 3, the clamp voltage (initial) right after the first diode Dz1 breaks down is high because the current Iz1 through the first diode Dz1 is large.

Along with the consumption of the energy accumulated in the inductive load L, the current through the inductive load L is reduced (FIG. 3B) and the current Iz1 through the first diode Dz1 is reduced so that the clamp voltage becomes lower (FIG. 3C).

When the current Id through the first switch element M1 becomes 0 and the active clamp operation is terminated (FIG. 3B), the clamping of the voltage Out across the first switch element M1 is released and the voltage Out across the first switch element M1 becomes equal to the voltage Vbat supplied to the inductive load L (FIG. 3C).

A clamp voltage (final) right before the active clamp operation is terminated is lower than the clamp voltage (initial) at the start of the active clamp operation.

The operating period of active clamp during which the energy accumulated in the inductive load L is consumed is determined by the current through the inductive load L and the clamp voltage. To shorten the active clamp period, the current through the inductive load L needs to be large and the clamp voltage needs to be high.

As described above, the clamp voltage (initial) at the start of the active clamp operation is high. Moreover, the current Iz1 through the first diode Dz1 is large. Accordingly, the change in the clamp voltage due to the fluctuation of the characteristics, e.g., the current-voltage characteristic, of the first diode Dz1 is large.

Thus, when the clamp voltage (initial) at the start of the active clamp operation is set to a value limited by a withstand voltage and the like in a case where the control circuit 3 is not provided, the clamp voltage (final) right before the active clamp operation is terminated is low.

Thus, without the control circuit 3, the operating period of active clamp is limited by the clamp voltage (initial) and cannot be shortened.

In contrast, in the active clamp circuit 1 of the first embodiment, the control circuit 3 can suppress the reduction of the clamp voltage Vclamp so that the clamp voltage Vclamp stays at a constant value. Moreover, the current Iz1 through the first diode Dz1 can be made small. Accordingly, the change of the clamp voltage due to the fluctuation of the characteristics of the first diode Dz1 can be made small.

Thus, the active clamp circuit 1 can shorten the operating period of active clamp.

Next, an operation in a period during which the power supply voltage Vdd is not supplied to the active clamp circuit 1 or grounded to the Gnd potential will be described.

The period during which the active clamp circuit 1 is not supplied with the power supply voltage Vdd includes a period during which the active clamp circuit 1 monolithically formed on a semiconductor substrate is in an on-wafer state, a period during which a semiconductor chip on which the active clamp circuit 1 is formed is assembled into a package, and a period during which the active clamp circuit 1 assembled into a package is mounted in a circuit substrate.

The active clamp circuit 1 does not operate when the power supply voltage Vdd is not supplied, i.e., when a power supply voltage terminal is opened, because a circuit which includes from inverter Inv1 to the resistances R2, R3 is electrically separated from a circuit which includes from the first switch element M1 to the diodes Df2, Df3.

When a surge is applied to the first switch element M1 in this state, the first diode Dz1 breaks down so that the current Iz1 flows. Thus, the voltage Vr1 is generated across the first resistance R1.

Even when the voltage Vr1 is clamped at Vf2+Vf3, without any path through which the surge is discharged, a drain voltage of the first switch element M1 further rises. The risen voltage may exceed a drain-source withstand voltage to break the first switch element M1.

FIGS. 4A and 4B are timing charts showing an operation of the active clamp circuit 1 not being supplied with the power supply voltage Vdd. FIG. 4A shows the voltage Out across the first switch element M1. FIG. 4B shows a gate voltage Vg1 of the first switch element M1.

As shown in FIG. 4, when the surge is applied to the first switch element M1 at a time point t1, the voltage Out across the first switch element M1 rises in accordance with the surge voltage.

When the voltage Out across the first switch element M1 becomes equal to the sum (Vz1+Vf1) of a breakdown voltage Vz1 of the first diode Df1 and the forward voltage Vf1 of the diode Df1 at a time point t2, the first diode Dz1 breaks down and the current Iz1 flows. The current Iz1 flows through the first resistance R1 to generate the voltage Vr1 across the first resistance R1.

The voltage Out across the first switch element M1 becomes equal to Vz1+Vf1+Vr1 due to the breakdown of the first diode Dz1.

The current Iz1 increases in accordance with the surge, and thus the voltage Vr1 across the first resistance R1 rises in accordance with the current Iz1. When the voltage Vr1 across the first resistance R1 exceeds the forward voltage Vf11 of the diode Df11, the diode Df11 becomes conductive. Thus, the gate capacitance of the first switch element M1 is charged by a current Iz2 flowing through the diode Df11 and the gate voltage Vg1 of the first switch element M1 rises.

When the voltage Vr1 across the first resistance R1 exceeds the sum (Vf11+Vth1) of the forward voltage Vf11 of the diode Df11 and a threshold value Vth1 of the first switch element M1 at a time point t3, the first switch element M1 turns on and the surge can be discharged to the ground Gnd. In this process, Vclamp=Vz1+Vf1+Vr1 and Vr1≥Vf11+Vth1.

Thus, the control circuit 3 can be prevented from being damaged by the surge. With the voltage Out across the first switch element M1 exceeding the drain-source withstand voltage Vdsmax of the first switch element M1, the first switch element M1 can be prevented from being damaged.

The first resistance R1 is connected in parallel with a series circuit including the diodes Df2, Df3, and thus the relationship Vf2+Vf3>Vr1>Vth1+Vf11 needs to be satisfied.

The first switch element M1 is preferably turned off promptly after the surge is discharged to the ground Gnd.

A resistance R8 connected between the gate of the first switch element M1 and the ground Gnd is a pull-down resistance to turn off the first switch element M1 or stabilize the gate voltage of the first switch element M1 while the power supply voltage Vdd is not supplied.

With the resistance R8, electrical charges charged in the gate capacitance of the first switch element M1 are promptly discharged so that the gate potential of the first switch element drops. Thus, the first switch element M1 can be promptly turned off.

While the power supply voltage Vdd is supplied to the active clamp circuit 1, the voltage Vr1 across the first resistance R1 does not exceed the sum of the forward voltage Vf11 of the diode Df11 and the threshold value Vth1 of the first switch element M1. Thus, the diode Df11 does not operate. This is because the amplifier circuit N2 amplifies the voltage Vr1 across the first resistance R1 to control the current Id through the first switch element M1.

The resistance R8 does not affect the operation of the control circuit 3 and especially causes no problem to the normal operation of the active clamp circuit 1.

As described above, the active clamp circuit 1 of the first embodiment includes the control circuit 3 that amplifies the voltage Vr1 across the first resistance R1 to control the current Id through the first switch element M1.

The active clamp circuit 1 further includes the diode Df11 that turns on the first switch element M1 in accordance with the voltage Vr1 across the first resistance R1 in response to an event where the surge is applied to the first switch element while the power supply voltage Vdd is not supplied to the active clamp circuit 1 or grounded to the Gnd potential.

As a result, the reduction of the clamp voltage Vclamp can be suppressed so that the clamp voltage Vclamp stays at a constant value. Furthermore, the surge voltage applied to the first switch element M1 while the power supply voltage Vdd is not supplied can be discharged to the ground Gnd.

Thus, the active clamp circuit with a shorter operating period of active clamp and an improved resistance against ESD can be obtained.

The description is given of a case where the current mirror 4 includes a bipolar transistor and a resistance. The current mirror 4 may include a pair of P-channel MOS transistors. The transistor N1 of the amplifier circuit N2 may be replaced with an N-channel MOS transistor. The diodes Df2, Df3 may be replaced with zener diodes. The operating period of active clamp can be similarly shortened in the above cases.

A resistance may be inserted to the drain of the second switch element M2 in series. The resistance delays the turning ON of the second switch element M2. The turning OFF of the first switch element M1 is delayed and the change of the current Id through the first switch element M1 is reduced.

The change of the current through the inductive load L is also reduced and the sharp change of the induced voltage is reduced. Ringing that may occur when the induced voltage rises as well as the peak of the induced voltage due to the ringing are lowered.

Thus, the clamp voltage limited by the withstand voltage and the like can be set high. Accordingly, the operating period of active clamp during which the current Id flows through the first switch element M1 can be further shortened.

Second Embodiment

Figure 5:
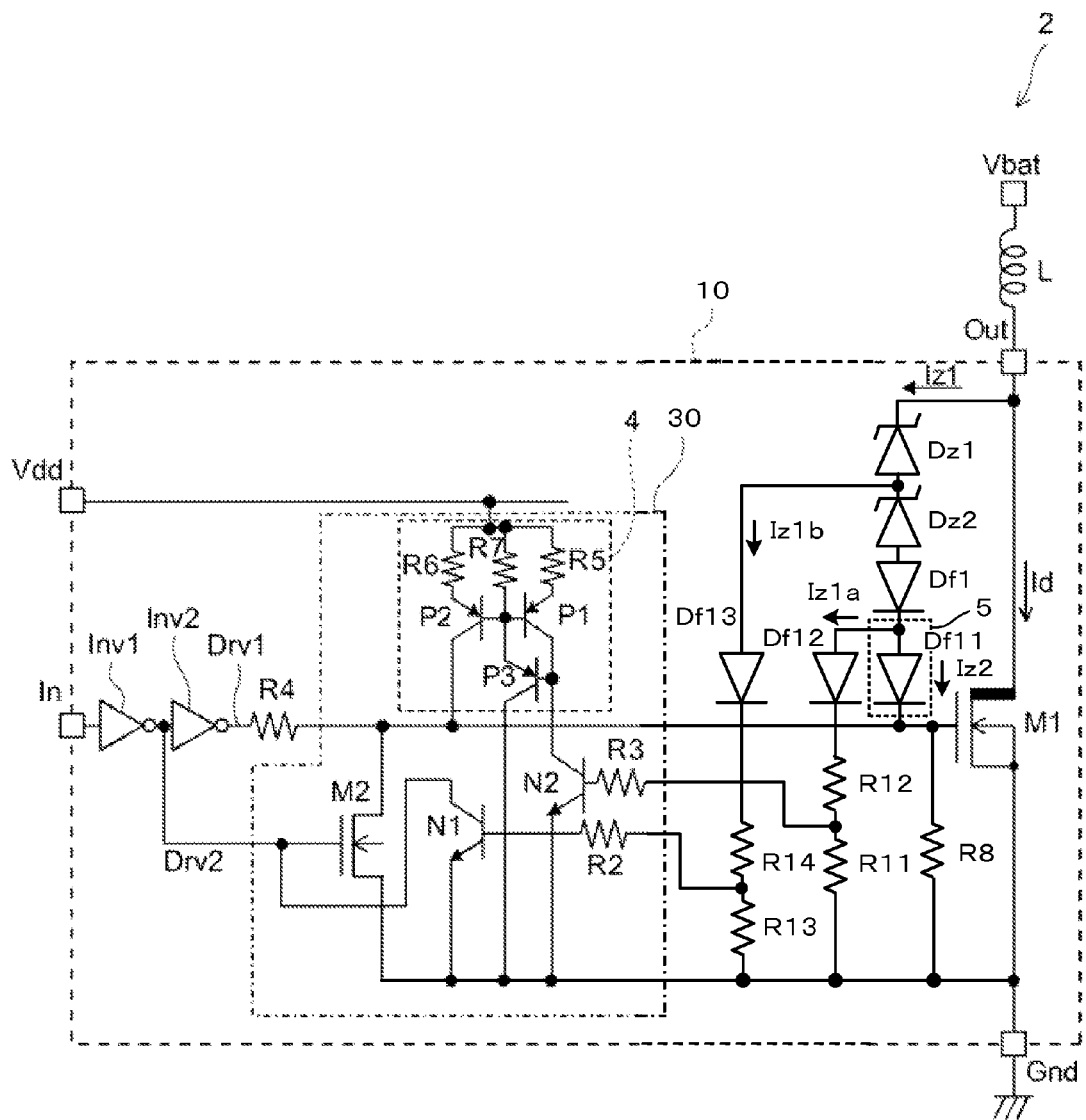
FIG. 5 is a circuit diagram showing a configuration of a driving circuit including an active clamp circuit according to a second embodiment.

An active clamp circuit of a second embodiment will be described with reference to FIG. 5. FIG. 5 is a circuit diagram of the active clamp circuit.

In the second embodiment, the portions that are the same as those in the first embodiment are denoted with the same reference numerals and the description of the portions is omitted. The description is given on different points. The second embodiment is different from the first embodiment in that two or more active clamp voltages are used.

Specifically, as shown in FIG. 5, in an active clamp circuit 10, a diode Dz2 (sixth diode) is connected between the first diode Dz1 and the diode Df1. The diode Dz2 is connected to the first diode Dz1 in forward direction and is connected to the diode Df1 in reverse direction. The diode Dz2 is a zener diode as is the first diode Dz1.

A diode Df13 (fifth diode), a resistance R14, and a resistance R13 are connected in series between a connection node between the first diode Dz1 and the diode Dz2 and the ground Gnd.

A diode Df12 (fifth diode), a resistance R12, and a resistance R11 are connected in series between a connection node between the diode Df1 and the diode Df11 and the ground Gnd.

The resistance R3 is connected to a connection node between the resistance R11 and the resistance R12. The resistance R2 is connected to a connection node between the resistance R13 and the resistance R14.

The diode Df13 is used to compensate a temperature of the first diode Dz1. The diode Df12 is used with diode Df1 to compensate the temperatures of the first diodes Dz1, Dz2 and to prevent the reverse flow when the first switch element M1 is turned on. The control circuit 30 has a configuration similar to that of the control circuit 3 shown in FIG. 1 except that the diodes Df2, Df3 are removed.

When the voltage Out across the first switch element M1 exceeds a predetermined value, the first diode Dz1 and the diode Dz2 break down. The current Iz1 through the first diode Dz1 is divided into a current Iz1$a$ that flows through a first current path passing through the diodes Dz2, Df1, Df12 and the resistances R12, R11 and a current Iz1$b$ that flows through a second current path passing through the diode Df13 and the resistances R14, R13.

The current Iz1$a$ is detected by the resistance R11 and a voltage corresponding to the current Iz1$a$ through the resistance R11 is generated. The current Iz1$b$ is detected by the resistance R13 and a voltage corresponding to the current Iz1$b$ through the resistance R13 is generated.

When the first diode Dz1 and the diode Dz2 break down, an active clamp voltage Vclamp 2 in the first current path to turn on the first switch element M1 and an active clamp voltage Vclamp3 in the second current path of the voltage Out across the first switch element M1 are represented by the following formulae.

$$Vclamp2 = 2Vz + 2Vf + Iz1a(R11+R12) \quad (2)$$

$$Vclamp3 = Vz + Vf + Iz1b(R13+R14) \quad (3)$$

The breakdown voltages of the first diode Dz1 and the diode Dz2 are both Vz and the forward voltages of the diodes Df1, Df2, Df3 are all Vf.

The voltage generated across the resistance R11 is amplified by the amplifier circuit N2 and the current which is outputted from the amplifier circuit N2 is reflected by the current mirror 4 to be inputted to the gate of the first switch element M1. A current required to turn on a transistor of the amplifier circuit N2 is represented by Iz1$a$=Vbe/R11.

The voltage generated across the resistance R13 turns on the transistor N1 and turns off the second switch element M2. A current required to turn on the transistor N1 is represented by Iz1$b$=Vbe/R13.

The active clamp voltage Vclamp2 is represented by the following formula.

$$Vclamp2 = 2Vz + 2Vf + Vbe(R11+R12)/R11 \quad (4)$$

The active clamp voltage Vclamp3 is represented by the following formula.

$$Vclamp3 = Vz + Vf + Vbe(R13+R14)/R13 \quad (5)$$

Since the current path of the current Iz1 in the active clamp circuit 10 is divided into the first and the second current paths, the voltage Vclamp2 which is required to turn on the first switch element M1 and the voltage Vclamp3 which is required to turn off the second switch element M2 can be individually determined.

In the active clamp circuit 1 shown in FIG. 1, the voltage to turn on the first switch element M1 and the voltage to turn off the second switch element M2 can be changed with the resistances R2, R3. However, the voltages are limited by the regulated voltages of the diodes Df2 and Df3.

Specifically, the relationships Vf2+Vf3>Vr2+VbeN1 and Vf2+Vf3>Vr3+VbeN2 need to be satisfied where Vr2 is the voltage across the resistance R2 and Vr3 is the voltage across the resistance R3. A difference between the voltage to turn on the first switch element M1 and the voltage to turn off the second switch element M2 cannot be equal to or larger than Vf2+Vf3.

In contrast, the difference between Vclamp2 and Vclamp3 can be equal to or larger than Vf2+Vf3 in the active clamp circuit 10. Thus, the active clamp circuit 10 can be operated by a voltage lower than Vclamp2.

Thus, the second switch element M2 is turned off and is switched to the pull-down resistance R8 so that the voltage smoothly changes from Vclamp3 to Vclamp2. Thus, the sharp peak voltage can be further prevented from occurring in the voltage Out.

Next, a description will be briefly given on an operation in a case where the power supply voltage Vdd is not supplied to the active clamp circuit 10 or grounded to the ground Gnd, which is basically the same with that of the active clamp circuit 1 shown in FIG. 1.

When the surge is applied to the first switch element M1, the voltage Out across the first switch element M1 rises in accordance with the surge voltage. The first diode Dz1 and the diode Dz2 break down due to the rise of the voltage Out across the first switch element M1 and thus the current Iz1 flows. A voltage Iz1$a$ (R11+R12) is generated across the resistances R11, R12 by the current Iz1$a$ flowing through the first current path.

The current Iz1 increases in accordance with the surge. Thus, the voltage across the resistances R11, R12 rises in accordance with the current Iz1. The diode Df11 becomes conductive when the sum of the voltage across the resistances R11, R12 and the forward voltage Vf12 of the diode Df12 exceeds the forward voltage Vf11 of the diode Df11. The gate capacitance of the first switch element M1 is charged by the current Iz2 flowing through the diode Df11 and the gate voltage Vg1 of the first switch element M1 rises.

The first switch element M1 turns on when the sum of the voltage across the resistances R11, R12 and the forward voltage Vf12 of the diode Df12 exceeds the sum of the forward voltage Vf11 of the diode Df11 and the threshold value Vth1 of the first switch element M1. Thus, the surge can be discharged to the ground Gnd.

At this time, the voltage Out is clamped at the voltage shown in Formula 2 and Iz1$a$×(R11+R12)≥Vth1 is satisfied.

As described above, the active clamp circuit 10 of the second embodiment includes the first and the second current paths and thus individually generates the active clamp voltage Vclamp2 to turn on the first switch element M1 and Vclamp3 to turn off the second switch element M2.

Thus, the timing at which the first switch element M1 is turned on and the timing at which the second switch element M2 is turned off can have wider range of adjustment. Accordingly, there are advantages that the operating period of active clamp can be further shortened and the sharp peak voltage can be prevented from occurring in the voltage Out.

The case where the diode Dz2 is connected between the first diode Dz1 and the diode Df1 has been described. Note that the effects of the second embodiment can be obtained without the diode Dz2. In such a case, an anode of the diode Df13 is connected to a connection node between the first diode Dz1 and the diode Df1.

A description has been given of the example in which the active clamp circuits 1, 10 are used in the driving circuit 2. Note that the active clamp circuits 1, 10 can drive an inductive load in a configuration different from that of the driving circuit 2. For example, the active clamp circuits 1, 10 may each be used as a low-side switch of a switching circuit including a high-side switch and the low-side switch.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. An active clamp circuit, comprising:
a first switch element;
a first diode connected to the first switch element to break down by an overvoltage applied to the first switch element;
a first resistance connected to the first diode to detect a current through the first diode;
a first control circuit including an amplifier circuit configured to amplify the voltage across the first resistance and to output a current, a current mirror circuit configured to receive the current outputted from the amplifier circuit and to control the current through the first switch element, and a second switch element configured to be controlled by the voltage across the first resistance and to control the current through the first switch element; and
a second control circuit configured to control a conduction of the first switch element in accordance with the voltage across the first resistance.

2. The active clamp circuit according to claim 1, wherein the second control circuit is connected between the first diode and a control terminal of the first switch element, and includes a second diode to become conductive in accordance with the voltage across the first resistance.

3. The active clamp circuit according to claim 2, wherein, while the first control circuit is not operating, the first switch element becomes conductive in response to an event where a voltage applied to the second diode exceeds a sum of a forward voltage of the second diode and a threshold value of the first switch element.

4. The active clamp circuit according to claim 1, wherein the first control circuit further includes a third diode to suppress an increase in the voltage across the first resistance.

5. The active clamp circuit according to claim 1, further comprising a fourth diode connected in series with the first diode and to compensate a temperature characteristic of the first diode.

6. The active clamp circuit according to claim 5, wherein the first control circuit further includes a third diode to suppress an increase in the voltage across the first resistance.

7. The active clamp circuit according to claim 5, further comprising a resistance connected between a control terminal of the first switch element and a ground terminal.

8. The active clamp circuit according to claim 1, further comprising a resistance connected between a control terminal of the first switch element and a ground terminal.

9. The active clamp circuit according to claim 1, wherein the current through the first diode is divided into a first current and a second current,
the amplifier circuit amplifies a voltage across the first resistance to detect the first current and outputs the current, and
the second switch element is controlled by a voltage across a second resistance to detect the second current.

10. The active clamp circuit according to claim 9, further comprising a diode connected in series with the first resistance to detect the first current and a diode connected in series with the second resistance to detect the second current, to compensate a temperature characteristic of the first diode.

11. The active clamp circuit according to claim 9, further comprising a sixth diode connected in series with the first diode so as to divide the current through the first diode into the first current and the second current, and being a same type as the first diode.

12. An active clamp circuit, comprising:
a first switch element;
a first diode connected to the first switch element to break down by an overvoltage applied to the first switch element;
a first resistance connected to the first diode to detect a current through the first diode;
an amplifier circuit configured to amplify the voltage across the first resistance and output a current;
a current mirror circuit configured to receive the current outputted from the amplifier circuit and to control the current through the first switch element;
a second switch element configured to be controlled by the voltage across the first resistance and to control the current through the first switch element; and
a second diode connected between the first diode and a control terminal of the first switch element, and becoming conductive in accordance with the voltage across the first resistance.

13. The active clamp circuit according to claim 12, wherein, while the amplifier circuit, the current mirror circuit and the second switch element are not operating, the first switch element becomes conductive in response to an event where a voltage applied to the second diode exceeds a sum of a forward voltage of the second diode and a threshold value of the first switch element.

14. The active clamp circuit according to claim 12, further comprising a third diode connected in parallel with the first resistance, to suppress an increase in the voltage across the first resistance.

15. The active clamp circuit according to claim 12, further comprising a resistance connected between a control terminal of the first switch element and a ground terminal.

16. The active clamp circuit according to claim 12, further comprising a fourth diode connected in series with the first diode, to compensate a temperature characteristic of the first diode.

17. The active clamp circuit according to claim 12, wherein the current through the first diode is divided into a first current and a second current,
- the amplifier circuit amplifies a voltage across the first resistance to detect the first current and outputs the current, and
- the second switch element is controlled by a voltage across a second resistance to detect the second current.

18. The active clamp circuit according to claim 17, further comprising a diode connected in series with the first resistance to detect the first current and a diode connected in series with the second resistance to detect the second current, to compensate a temperature characteristic of the first diode.

19. The active clamp circuit according to claim 17, further comprising a sixth diode connected in series with the first diode so as to divide the current through the first diode into the first current and the second current, and being a same type as the first diode.

\* \* \* \* \*